United States Patent
Butler et al.

(10) Patent No.: US 10,578,983 B2
(45) Date of Patent: Mar. 3, 2020

(54) LITHOGRAPHIC APPARATUS HAVING AN ACTIVE BASE FRAME SUPPORT

(71) Applicant: ASML NETHERLANDS B.V., Veldhoven (NL)

(72) Inventors: Hans Butler, Best (NL); Björn Hubertus Maria Bukkems, Best (NL); Cornelius Adrianus Lambertus De Hoon, Eindhoven (NL); Maurice Willem Jozef Etiënne Wijckmans, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/062,735

(22) PCT Filed: Nov. 17, 2016

(86) PCT No.: PCT/EP2016/077954
§ 371 (c)(1),
(2) Date: Jun. 15, 2018

(87) PCT Pub. No.: WO2017/108284
PCT Pub. Date: Jun. 29, 2017

(65) Prior Publication Data
US 2018/0373156 A1 Dec. 27, 2018

(30) Foreign Application Priority Data

Dec. 21, 2015 (EP) .................................. 15201466

(51) Int. Cl.
*G03F 7/20* (2006.01)
(52) U.S. Cl.
CPC .......... *G03F 7/709* (2013.01); *G03F 7/70758* (2013.01); *G03F 7/70775* (2013.01); *G03F 7/70825* (2013.01); *G03F 7/70833* (2013.01)

(58) Field of Classification Search
CPC ............ G03F 7/70525; G03F 7/70766; G03F 7/70833
(Continued)

(56) References Cited

U.S. PATENT DOCUMENTS 6,036,162 A * 3/2000 Hayashi .................. F16F 15/00
248/550
6,062,551 A 5/2000 Oku et al.
(Continued)

FOREIGN PATENT DOCUMENTS

| EP | 1124078 A2 | 8/2001 |
| JP | 2009291969 A | 11/1997 |

(Continued)

OTHER PUBLICATIONS

International Search Report PCT/EP2016/077954 dated Feb. 17, 2017.
(Continued)

*Primary Examiner* — Hung Nguyen
(74) *Attorney, Agent, or Firm* — Arent Fox LLP

(57) ABSTRACT

A lithographic apparatus comprises a base frame constructed to form a supporting structure of the lithographic apparatus, an active base frame support arranged between the base frame and a ground floor. The active base frame support is configured to support the base frame on the ground floor. The active base frame support comprises an actuator configured to exert a force in a horizontal direction between the base frame and the ground plane. The lithographic apparatus further comprises a control device configured to drive the actuator, a signal representative of a disturbance force on the base frame being provided to the control device, the control device being configured to drive the actuator using the force sensor signal.

20 Claims, 4 Drawing Sheets

(58) Field of Classification Search
USPC .............................................. 355/53, 72–76
See application file for complete search history.

(56) References Cited

U.S. PATENT DOCUMENTS

| | | | |
|---|---|---|---|
| 6,170,622 B1 * | 1/2001 | Wakui | F16F 15/02 |
| | | | 188/378 |
| 6,477,908 B1 | 11/2002 | Wakui | |
| 7,072,777 B1 * | 7/2006 | Wakui | F16F 15/02 |
| | | | 702/109 |
| 7,248,339 B2 | 7/2007 | Van Schothorst et al. | |
| 2001/0011697 A1 | 8/2001 | Wakui et al. | |
| 2001/0040324 A1 | 11/2001 | Mayama et al. | |
| 2003/0057346 A1 | 3/2003 | Wakui | |
| 2005/0041233 A1 | 2/2005 | Van Schothorst et al. | |
| 2010/0149516 A1 * | 6/2010 | Loopstra | G03F 7/70525 |
| | | | 355/74 |

FOREIGN PATENT DOCUMENTS

| | | |
|---|---|---|
| JP | H11294520 A | 10/1999 |
| JP | 2001027280 A | 1/2001 |
| KR | 20000006401 A | 1/2000 |
| TW | 535227 B | 6/2003 |

OTHER PUBLICATIONS

Office Action issued in CN Application No. 201680074430.5, dated Oct. 30, 2019, pp. 1-8.

* cited by examiner

LITHOGRAPHIC APPARATUS HAVING AN ACTIVE BASE FRAME SUPPORT

CROSS-REFERENCE TO RELATED APPLICATIONS

This application claims priority of EP application 15201466.8 which was filed on Dec. 21, 2015 and which is incorporated herein in its entirety by reference.

BACKGROUND

Field of the Invention

The present invention relates to a lithographic apparatus having an active base frame support.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, a support, such as a support of the substrate or a support of a patterning device, moves during operation, e.g. to perform scanning movements. Thereto an actuator is provided such as an electric motor or a plurality of electric motors, e.g. planar motors. The actuator may for example comprise a short stroke actuator that performs accurate positioning over a smaller range of movement, combined with a long stroke actuator that provides for a positioning over a large range of movement. The actuator moves the support in respect of a balance mass. As a center of gravity of the support (plus substrate or patterning device held by the support) does not coincide with a center of gravity of the balance mass, a resulting counter force on the balance mass may provide a torque on the balance mass. The support may be positioned on top of the balance mass (i.e. spaced apart in the Z direction), providing that a horizontal force by the actuator, e.g. a force in x or y direction, provides for a counter force in opposite direction as well as a torque around the y respectively the x direction on the balance mass. The X and Y directions being defined as forming a horizontal plane perpendicular to the Z direction.

The balance mass is supported by a base frame of the lithographic apparatus, which is in turn supported by a ground plane (e.g. a ground floor, a pedestal, etc.) of a building in which the lithographic apparatus is arranged.

Vibrations, torques and effects of counter movements tend to result in disturbances in a positioning of the support, which may result in overlay errors of the lithographic apparatus.

In case no balance mass is provided, movements of the supports may similarly result in disturbing forces on the base frame of the lithographic apparatus. Due to the absence of a balancing effect of the balance mass, the disturbance forces on the base frame may even be more severe.

SUMMARY

It is desirable to provide an accurate positioning of the support.

According to an embodiment of the invention, there is provided a lithographic apparatus comprising:
a base frame constructed to form a supporting structure of the lithographic apparatus,
an active base frame support configured to support the base frame on a ground plane, the active base frame support comprising an actuator configured to exert a force in a horizontal direction on the base frame
the lithographic apparatus further comprising:
a control device configured to drive the actuator, a signal representing a force on the base frame being provided to the control device, the control device being configured to drive the actuator based on the signal representing the force on the base frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
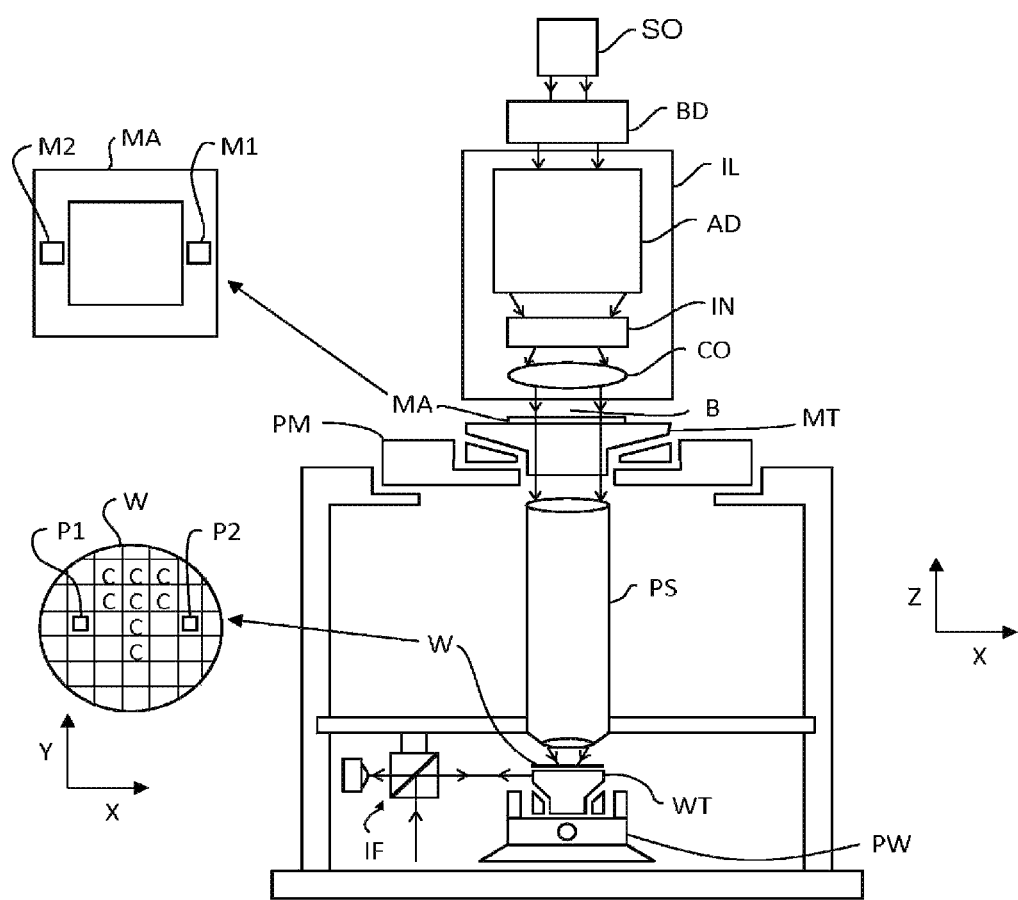
FIG. 1 depicts a lithographic apparatus in which the invention may be embodied.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As explained above, the actuator moves the support (substrate support or patterning device support) in respect of a balance mass. As a centre of gravity of the support is spaced apart in Z direction from a centre of gravity of the balance mass, a resulting counter force on the balance mass may provide a torque on the balance mass. In particular, a horizontal force by the actuator, e.g. a force in X or Y direction, provides for a counter force in opposite direction as well as a torque around the Y respectively the X direction on the balance mass.

A solution to at least partly compensate for the forces on the balance mass has been devised in a form of an active base frame support. Thereby the supports that support the base frame in respect of the ground floor are provided with a base frame support actuator, such as a piezo actuator or any other actuator, such as a motor. The support actuator is configured to exert a force in a vertical (Z) direction. Hence, a torque onto the base frame, as a result of the support being moved in a horizontal direction, may be compensated: When the base frame support actuator exerts a force onto the support in the X direction, an Ry torque results onto the balance mass. When the base frame support actuator exerts a force onto the support in the y direction, an Rx torque results onto the balance mass. Such torques on the balance mass may at least partly be compensated by actuation of the base frame support actuators, wherein actuation of a vertical force in upward direction on one side of the base frame and in downward direction on the other side of the base frame may generate an at least partly compensating torque. The base frame support actuator(s) may be driven by a suitable control device. A force sensor that is configured to sense a vertical force may be comprised in the base frame support, e.g. in a form of a piezo sensor or any other force sensor. An output signal of the force sensor may be provided to the control device, the control device may accordingly be configured to drive the base frame support actuators responsive to (inter alia) the output signal(s) of the force sensor(s) in the base frame supports.

Figure 2:
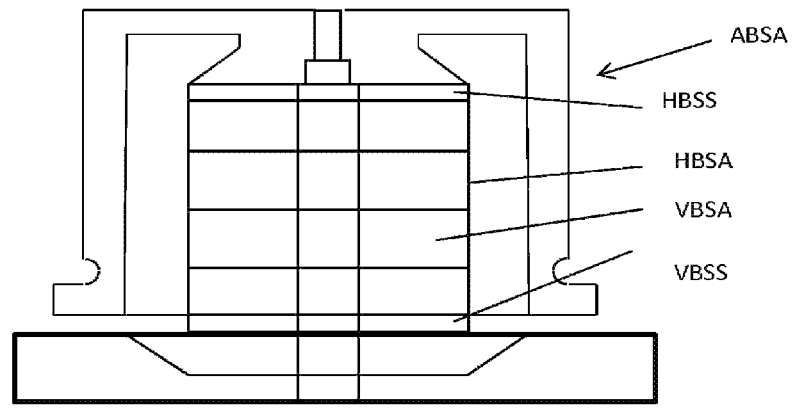
FIG. 2 depicts a schematic side view of an active base frame support for use in a lithographic apparatus according to an embodiment of the invention.

FIG. 2 depicts an active base frame support actuator ABSA comprising both a vertical base frame support actuator VBSA as well as a horizontal base frame support actuator HBSA. In the present embodiment, the base frame support actuator comprises a vertically stacked piezo stack, comprising from bottom to top a vertical piezo force sensor VBSS, a vertical piezo actuator VBSA, a horizontal piezo actuator HBSA and a horizontal piezo force sensor HBSS. The horizontal piezo actuator may for example be a sheer piezo actuator. Hence a piezo stack is provided that enables both vertical and horizontal sensing and actuation. The horizontal sensing and actuation may be in a single horizontal direction, such as in the X-direction or the Y-direction. Also, actuation and sensing in both X and Y may be provided, e.g. by providing dual horizontal piezo actuators and sensors. It is noted that the horizontal and vertical actuators may be exchanged, i.e. the vertical actuator on top of the horizontal actuator. A mechanical decoupling may be provided between the horizontal actuator and horizontal sensor so as to reduce a cross talk from actuator to sensor. Likewise, a mechanical decoupling may be provided between the vertical actuator and vertical sensor. A protection mechanism may be provided to ensure that forces on the actuator piezo elements will be exceed a maximum, thus to protect the piezo actuators against overload.

Figure 3:
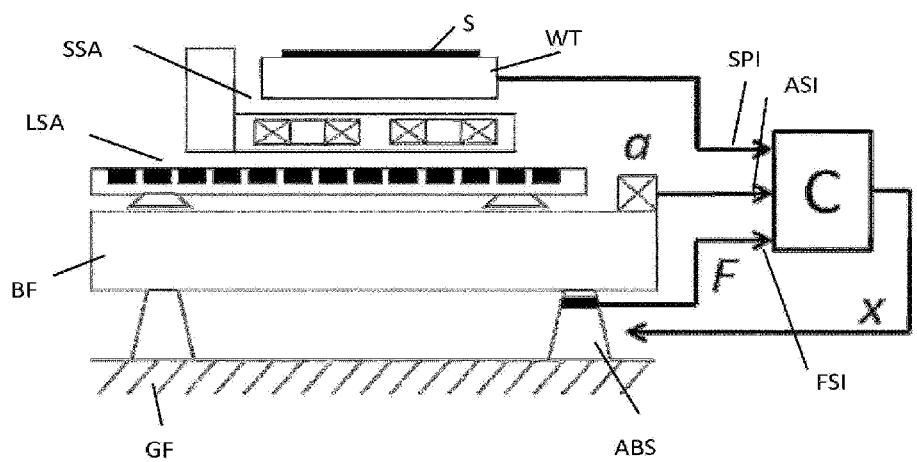
FIG. 3 depicts a highly schematic side view of a part of a lithographic apparatus according to an embodiment of the invention.

FIG. 3 depicts an embodiment in which the active base frame support as described with reference to FIG. 2 may be applied. FIG. 3 depicts a stage, such as in this example a substrate stage (i.e. a substrate table) positioned by a short stroke actuator SSA and a long stroke actuator LSA, each being formed by a motor, such as a planar motor. FIG. 3 schematically depicts coils of the long stroke actuator in a moving part thereof and magnets in a stationary part hereof. It is noted that an embodiment where coils and magnets are interchanged, may be applied also. The stationary part of the long stroke actuator is supported by a base frame BF. The base frame forms a supporting structure of the lithographic apparatus. The base frame in turn is supported by a ground plane (e.g. formed by a pedestal or a ground floor GF) by means of active base frame supports ABS, such as four of the active base frame supports each as depicted in and described with reference to FIG. 2. Although the present example is based on a substrate stage, a similar principle may be applied to any other moving part of the lithographic apparatus, such as a support that supports a patterning device (such as a mask table), or a reticle mask. Therefore, where in this example reference is made to the stage, substrate table or wafer table, is it to be understood that any other support may be intended as well.

The term horizontal or horizontal direction refer to a direction in a horizontal plane, commonly a plane parallel to the ground plane. Correspondingly, the term vertical or vertical direction refers to a direction perpendicular to the horizontal plane, thereby being perpendicular to the horizontal direction. In an embodiment, the horizontal direction in which the active base frame actuator actuates respectively in which the force sensor measures, is a scanning direction of the lithographic apparatus, which direction may be defined as the Y direction.

FIG. 3 further highly schematically depicts a control device C. The control device is provided with a signal representative of a disturbance force on the base frame. A driving output of the control device drives the active base frame support actuator in response to the signal representative of the disturbance force. The signal representing the force on the base frame may represent a disturbance force, such as a horizontal disturbance force. Many embodiments of the signal representative of the disturbance force are provided, as described in more detail below. For example, as described in more detail below, the signal may be formed by a setpoint signal of the support, a force sensor signal of a force sensor on the base frame or on the active base frame support, an acceleration signal provided by an accelerometer on the base frame, an accelerometer provided on the ground floor or pedestal, etc. Any combinations of the signals as described may be provided to the control device, so as to provide driving of the actuator by the control device based on the combination of signals.

In an embodiment, the control device is provided at a force signal input FSI with output signals from force sensors of the active base frame supports. The force sensors in the active base frame supports provide information to the control device about disturbances as sensed in the active base frame supports. A driving output of the control device drives the active base frame support actuator, such as the Z direction actuator and/or the horizontal actuator. The horizontal force sensing in the active base frame supports combined with horizontal actuation of the active base frame supports via the horizontal actuators, enables to damp resonances in horizontal direction. Using multiple of such active base frame supports, for example 4 of such active base frame supports each at a corner or edge of the base frame, rotations about the vertical direction may be counteracted likewise. It is noted that the force sensor may be provided in the active base frame support, the base frame or otherwise.

In an embodiment, referring to the embodiment of an active base frame support as described with reference to FIG. 2, both the output signals from the vertical force sensor and horizontal force sensor are provided to the control device. Correspondingly, a combination of horizontal and vertical force sensing in the active base frame supports combined with horizontal as well as vertical actuation of the active base frame supports via the horizontal and vertical actuators, enables to damp resonances in vertical as well as horizontal direction as well as rotations about these directions. In case of multiple active base frame supports, one controller may be provided for all four active base frame support systems. This controller receives force sensor inputs form all ABSs, acceleration signals from one or more accelerometers, and stage setpoint information, and distributes the output signals towards the actuators of the multiple active base frame supports.

Furthermore, the control device may provided with a setpoint of the support at a setpoint input SPI, which enables the control device to derive therefrom information about a desired position, velocity and acceleration of the support. The setpoint of the support is hence used as a feedforward signal, whereby the setpoint of the support provides information about a disturbance of the base frame by the movements, accelerations etc. of the support.

A further input signal to the control device may be provided by an acceleration sensor on the base frame. The acceleration signal as provided by the acceleration sensor at an acceleration sensor input ASI may provide information about vibrations of the base frame. For example, a respective accelerometer may be provided on the base frame in a proximity of each one of the active base frame supports. Using 4 active base frame supports at respective edges or corners of the base frame, 4 accelerometers may be provided, each one at a respective one of the edges or corners. Using the multiple accelerometers, information about excitation of resonance modes, bending modes torsion modes, etc. of the base frame may be taken into account by the control device. The accelerometers may be positioned on the base frame proximate to the respective active base frame supports, so as to provide an acceleration signal to the control device that relates as closely as possible to acceleration figures subjected to the base frame near the base frame support, thereby enabling a more accurate control. A number of accelerometers could be higher than 4, especially when also horizontal directions or various resonance modes or torsion modes need to be measured.

Using the above described inputs, a combination of feedforward and feedback may provided, whereby the support setpoint forms a feedforward input signal while the acceleration and force sensor signals provide feedback input signals, the combination of feedforward and feedback providing a fast response to support movements, by the feedforward in combination with accuracy by the feedback.

Figure 4:
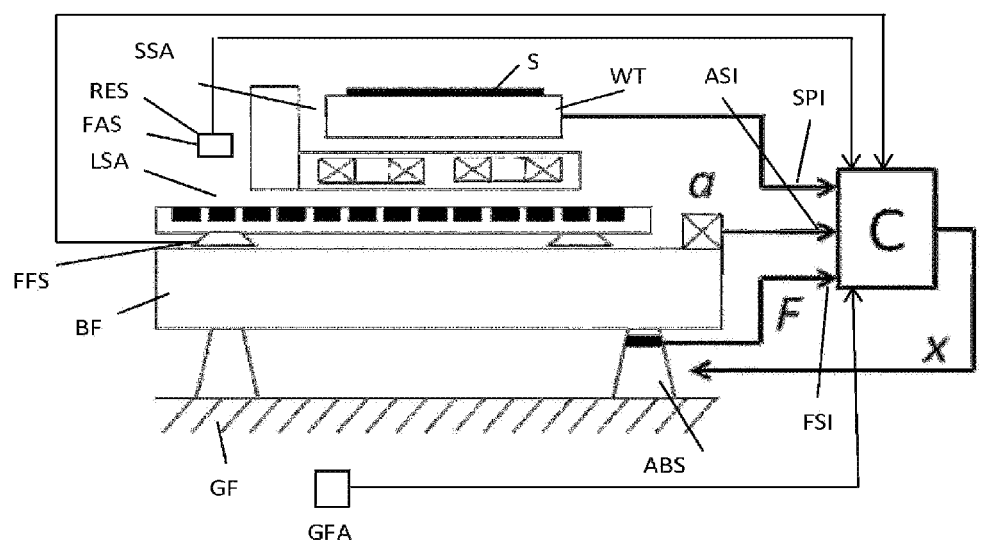
FIG. 4 depicts a highly schematic side view of a part of a lithographic apparatus according to another embodiment of the invention.

FIG. 4 depicts another embodiment, wherein additional sensors have been added to the system as described above. Some possible additional sensors providing a signal representative of the (disturbance) force on the base frame are described below.

A first possible additional sensor may be provided by a further accelerometer (a further acceleration sensor FAS), for example a further accelerometer provided at or near a structure RES of the lithographic apparatus that shows a tendency to resonate. For example a support balance mass, such as a substrate stage balance mass, may tend to resonate. Positioning an acceleration sensor or acceleration sensors at such structure or at a location where resonances of such structure may be detected, the acceleration sensor signal as provided to the control device enables the control device to dampen an effect of such resonances on the base frame, by means of the control device being configured to actuate the active base frame support actuators accordingly.

A second possible additional sensor would be provided in a form of a further force sensor FFS, for example force sensors in a support (e.g. wafer stage or reticle stage) to base frame connection. The force sensor may be positioned in a force path towards the base frame. A force sensor signal is provided to the control device at a force sensor input. The control device drives the active base frame support actuator to at least partly compensate for an effect of the force on the base frame. These sensors may for example be provided in a mounting of the support (e.g. stage module) to the base frame.

A still further additional sensor may be provided in a form of a ground floor accelerometer GFA mounted at the ground floor or pedestal which supports the active base frame supports. Vibrations propagating via the ground floor, such as vibrations from other devices in an environment of the lithographic apparatus, may be detected by such sensor, and an effect of such vibrations onto the base frame may at least partly be counteracted by the control device receiving a ground floor accelerometer signal at a ground floor accelerometer input and driving the active base frame supports to at least partly compensate the detected vibrations. Thereby, propagation of such ground floor vibrations into base frame may to a large extent be prevented.

Figures 5A, 5B, 5C:
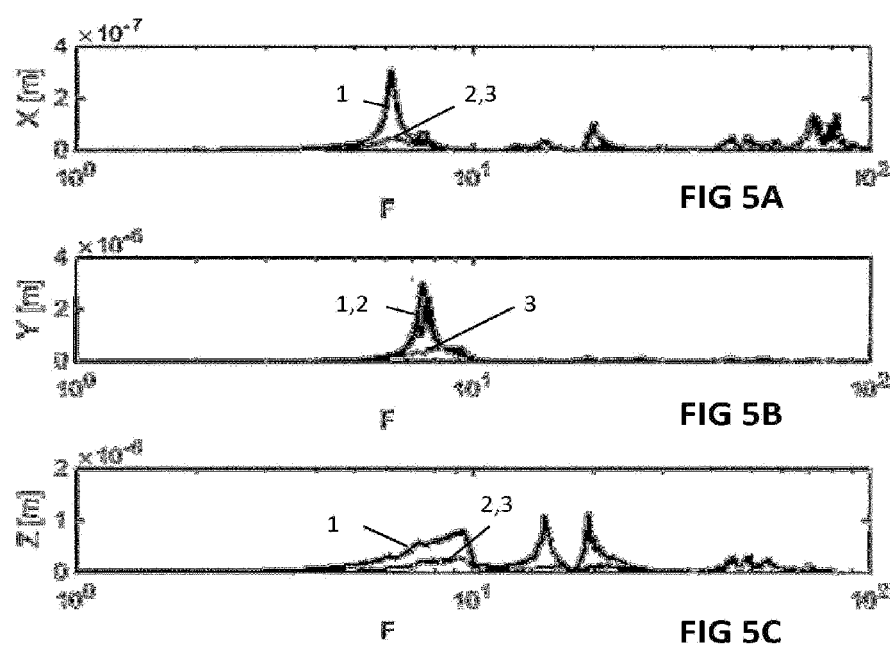
FIG. 5A-5C depict time diagrams of base frame vibration in order to illustrate an effect of the embodiment of the invention as described with reference to FIG. 3.

FIG. 5A-5C depict a result of the active base frame support damping, wherein actuation of the active base frame supports both in horizontal and in vertical direction is provided. FIG. 5A depicts a frequency spectrum of the base frame position in X direction as a function of frequency, FIG. 5B depicts a frequency spectrum of the base frame position in Y direction as a function of frequency, and FIG. 5C depicts a frequency spectrum of the base frame position in Z direction as a function of frequency. FIGS. 5A, 5B and 5C each depict a configuration without active base frame supports (identified as 1), a configuration with active base frame supports having actuation and sensing in the vertical (Z) direction (identified as 2), and a configuration with active base frame supports having actuation and sensing in the vertical (Z) as well as the horizontal (in this example Y) direction (identified as 3). In the example, the active base frame supports are controlled by a combination of feedforward from the support setpoint and feedback from the base frame acceleration sensors and the active base frame support force sensors. In the present example, stage motion profiles are applied as an excitation causing the resonances.

As follows from FIGS. 5A, 5B and 5C, the configuration with passive base frame supports exhibits some degree of resonance in X, Y and Z direction. The configuration with active base frame supports having actuators in the base frame supports that effectuate in vertical direction in combination with force sensors acting in the vertical direction shows that the resonances in the X direction and Z direction have diminished, while resonance in Y direction remains. Adding to the base frame supports the actuation in the Y direction and corresponding measurement of the forces in the base frame supports in the Y direction reduces the resonances in the Y direction, as follows form FIG. 5B.

As the resonances of the base frame may be reduced by the configuration with active base frame supports with actuation and sensing in the vertical and horizontal (e.g. Y) direction, a more stable positioning of the base frame may be provided, which results in less disturbances onto the support in operation, hence in a more accurate positioning of the support. The more accurate positioning of the support may result in less overlay errors in the lithographic process.

The principle as described above may be applied to any support. For example, the support may be formed by the substrate table. Also, the support may be formed by a support of the patterning device, such as a mask table. Furthermore, the support may be formed by a Reticle Mask. Generally, using the techniques as described in the present document, disturbance forces acting on the base frame may be compensated to a large extent. The disturbance forces may originate from moving parts in the lithographic apparatus causing e.g. torques on the base frame. Furthermore, disturbances from other sources may be compensated using extra sensors, such as disturbances propagating through the ground floor, disturbances caused by resonances in other structures of the lithographic apparatus, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a base frame constructed to form a supporting structure of the lithographic apparatus;
a force sensor arranged to sense a magnitude of a force on the base frame and adapted to generate a signal indicative of the magnitude of the force on the base frame;
an active base frame support configured to support the base frame on a ground plane, the active base frame support comprising an actuator configured to exert a force in a horizontal direction on the base frame; and
a control device configured to drive the actuator, a signal indicative of a magnitude a force on the base frame being provided to the control device, the control device being configured to drive the actuator based at least in part on the signal indicative of a magnitude of the force on the base frame.

2. A lithographic apparatus comprising;
a base frame constructed to form a supporting structure of the lithographic apparatus;
an active base frame support configured to support the base frame on a ground plane, the active base frame support comprising an actuator configured to exert a force in a horizontal direction on the base frame; and
a control device configured to drive the actuator, a signal representing a force on the base frame being provide to the control device, the control device being configured to dive the actuator based at least in part on the signal representing the force on the base frame,
wherein the signal representing the force on the base frame comprises a setpoint signal of the support, the control device comprises a setpoint input, the setpoint signal of the support being provided to the setpoint input of the control device, the control device being configured to drive the actuator based at least in part on the setpoint signal.

3. The lithographic apparatus according to claim 2, wherein the control device is configured to use the setpoint signal of the support as a feedforward signal.

4. The lithographic apparatus according to claim 1, wherein the force sense comprises a horizontal force sensor configured to measure a horizontal force on the base frame, the signal indicative of a magnitude of the force on the base frame comprising a horizontal force sensor signal of the horizontal force sensor, the control device comprising a horizontal force sensor input configured to receive the horizontal force sensor signal of the horizontal force sensor; the control device being configured to drive the actuator based at least in part on the horizontal force sensor signal.

5. The lithographic apparatus according to claim 4, wherein the horizontal force sensor is comprised in the active base frame support.

6. The lithographic apparatus according to claim 1, wherein the base frame is provided with an accelerometer configured to sense an acceleration of the base frame, the signal indicative of a magnitude of the force on the base frame comprising an accelerometer signal of the accelerometer, wherein the control device further comprises an accelerometer input, the accelerometer signal of the accelerometer being provided to the accelerometer input, and wherein the control device is configured to drive the actuator based at least in part on the accelerometer signal.

7. The lithographic apparatus according to claim 6, wherein the accelerometer is positioned at the base frame near the active base frame support.

8. The lithographic apparatus according to claim 1, further comprising a further accelerometer at or in proximity to a structure of the lithographic apparatus, the signal indicative of a magnitude of the force on the base frame comprising an output signal of the further accelerometer, the control device comprising an further accelerometer input, the output signal of the further accelerometer being provided to the further accelerometer input of the control device, the control device being configured to drive the actuator in response to the output signal of the further accelerometer in order to reduce an effect of a resonance of the structure on the base frame.

9. The lithographic apparatus according to claim 1, further comprising a second force sensor arranged in a force path from a moving part of the lithographic apparatus to the base frame, the signal representing a force on the base frame comprising an output signal of the second force sensor, the control device comprising a second force sensor input, the output signal of the second force sensor being provided to the second force sensor input of the control device, the control device being configured to drive the actuator in response to the output signal of the second force sensor in order to reduce an effect of a propagation of the force along the force path to the base frame.

10. A lithographic apparatus comprising:
a base frame constructed to form a supporting structure of the lithographic apparatus;
an active base frame support configured to support the base frame on a ground plane, the active base frame support comprising an actuator configured to exert a force in a horizontal direction on the base frame; and
a control device configured to drive the actuator, a signal representing a force on the base frame being provided to the control device, the control device being configured to drive the actuator based at least in part on the signal representing the force on the base frame, wherein the ground plane is formed by a ground floor, the lithographic apparatus further comprising a ground floor accelerometer arranged at the ground floor, the signal indicative of a magnitude of the force on the base frame comprising an output signal of the ground floor accelerometer, the control device comprising a ground floor accelerometer input, the output signal of the ground floor accelerometer being provided to the ground floor accelerometer input of the control device, the control device being configured to drive the actuator in response to the output signal of the ground floor accelerometer in order to reduce an effect of a propagation of a vibration propagating via the ground floor to the base frame.

11. The lithographic apparatus according to claim 1, wherein the lithographic apparatus further comprises a vertical force sensor configured to measure a vertical force on the base frame, the control device comprises a vertical force sensor input, a vertical force sensor signal of the vertical force sensor being provided to the vertical force sensor input, the control device being configured to drive the actuator using the vertical force sensor signal.

12. The lithographic apparatus according to claim 1, wherein the support comprises one of:
a support constructed to support a patterning device, the patterning device being capable of imparting the radiation beam with a pattern in its cross-section to form a patterned radiation beam;
a masking device configured to mask a part of the patterning device, and
a substrate table constructed to hold a substrate.

13. The lithographic apparatus according to claim 12, wherein the horizontal direction of the active base frame actuator is a scanning direction of a scanning movement of the substrate table.

14. The lithographic apparatus according to claim 1, wherein the active base frame support comprises a stack of horizontal and vertical piezo actuators and horizontal and vertical force sensors.

15. The lithographic apparatus according to claim 2, wherein the force sensor comprises a horizontal force sensor configured to measure a horizontal force on the base frame, the signal indicative of a magnitude of the force on the base frame comprising a horizontal force sensor signal of the horizontal force sensor, the control device comprising a horizontal force sensor input configured to receive the horizontal force sensor signal of the horizontal force sensor, the control device being configured to drive the actuator based at least in part on the horizontal force sensor signal.

16. The lithographic apparatus according to claim 15, wherein the horizontal force sensor is comprised in the active base frame support.

17. The lithographic apparatus according to claim 3, wherein the force sensor comprises a horizontal force sensor configured to measure a horizontal force on the base frame, the signal indicative of a magnitude of the force on the base frame comprising a horizontal force sensor signal of the horizontal force sensor, the control device comprising a horizontal force sensor input configured to receive the horizontal force sensor signal of the horizontal force sensor, the control device being configured to drive the actuator based at least in part on the horizontal force sensor signal.

18. The lithographic apparatus according to claim 17, wherein the horizontal force sensor is comprised in the active base frame support.

19. The lithographic apparatus according to claim 2, wherein the base frame is provided with an accelerometer configured to sense an acceleration of the base frame, the signal indicative of a magnitude of the force on the base frame comprising an accelerometer signal of the accelerometer, wherein the control device further comprises an accelerometer input, the accelerometer signal of the accelerometer being provided to the accelerometer input, and wherein the control device is configured to drive the actuator based at least in part on the accelerometer signal.

20. The lithographic apparatus according to claim 3, wherein the base frame is provided with an accelerometer configured to sense an acceleration of the base frame, the signal indicative of a magnitude of the force on the base frame comprising an accelerometer signal of the accelerometer, wherein the control device further comprises an accelerometer input, the accelerometer signal of the accelerometer being provided to the accelerometer input, and wherein the control device is configured to drive the actuator based at least in part on the accelerometer signal.

* * * * *

UNITED STATES PATENT AND TRADEMARK OFFICE
CERTIFICATE OF CORRECTION

PATENT NO. : 10,578,983 B2
APPLICATION NO. : 16/062735
DATED : March 3, 2020
INVENTOR(S) : Butler et al.

Page 1 of 1

It is certified that error appears in the above-identified patent and that said Letters Patent is hereby corrected as shown below:

In the Specification

In Column 1, Lines 7-9, replace "This application claims priority of EP application 15201466.8 which was filed on Dec. 21, 2015 and which is incorporated herein in its entirety by reference" with --This application is the U.S. National Stage Application of International Patent Application No. PCT/EP2016/077954, filed on November 17, 2016 which claims priority of EP application EP15201466.8 which was filed on December 21, 2015 both of which are incorporated herein in their entirety by reference--.

In the Claims

In Column 10, Line 66, replace "a magnitude a force" with --a magnitude of a force--.

In Column 11, Line 12, replace "being provide" with --being provided--.

In Column 11, Line 14, replace "dive the actuator" with --drive the actuator--.

In Column 11, Line 27, replace "the force sense comprises" with --the force sensor comprises--.

In Column 11, Line 33, replace "horizontal force sensor;" with --horizontal force sensor,--.

In Column 11, Line 57, replace "an further accelerometer" with --a further accelerometer--.

Signed and Sealed this
Twenty-eighth Day of July, 2020

Andrei Iancu
*Director of the United States Patent and Trademark Office*